United States Patent [19]

Lamorte

[11] 4,179,702
[45] Dec. 18, 1979

[54] CASCADE SOLAR CELLS

[75] Inventor: Michael F. Lamorte, Durham, N.C.

[73] Assignee: Research Triangle Institute, N.C.

[21] Appl. No.: 885,077

[22] Filed: Mar. 9, 1978

[51] Int. Cl.² .................................................. H01L 27/14
[52] U.S. Cl. ........................................ 357/30; 357/19; 357/17; 357/18; 357/12
[58] Field of Search .................... 357/30, 19, 17, 18, 357/12

[56] References Cited

U.S. PATENT DOCUMENTS

| | | | |
|---|---|---|---|
| 3,748,480 | 7/1973 | Coleman | 250/211 J |
| 3,852,798 | 12/1974 | Lebailly | 357/19 |
| 3,881,113 | 4/1975 | Rideout | 250/551 |
| 4,017,332 | 4/1977 | James | 136/89 PC |
| 4,068,252 | 10/1978 | Lebailly | 357/17 |

*Primary Examiner*—Martin H. Edlow
*Attorney, Agent, or Firm*—Cushman, Darby & Cushman

[57] ABSTRACT

A monolithic cascade cell for converting incident radiation, particularly solar radiation, into electrical energy at a high efficiency with at least three layers of semiconductive Group III-IV material. The top layer is doped into p and n regions with a homojunction therebetween and has a bandgap such that photons above a predetermined energy interact with the semi-conductive material to produce a potential across the homojunction and current flow and photons below that energy pass through the first layer to a second similar layer having a lower bandgap so that some of the radiation passing through the first layer produces a potential across a homojunction in the second layer to improve the overall energy conversion efficiency of the cell. The first and second layers are separated by at least a third layer of a Group III-V material, similarly doped into p and n regions with a tunnel junction formed therebetween to provide a low voltage electrical connection between the first and second layers. In one embodiment, the first and second layers are connected in series to be additive so that current flow takes place between contacts associated with the first and second layers. In another embodiment, the first and second layers are connected in opposition with a third terminal connected to the third layer which, in this case, need not be a tunnel junction. Alternatively, the two layers may be light producing devices such as light emitting diodes (LEDs), emitting light at different wavelengths, or photodiodes, detecting light of different wavelengths, or one layer can be a light producing device such as an LED while the other layer is a light receiving device such as a photodiode, again operating at different wavelengths.

25 Claims, 5 Drawing Figures

CASCADE SOLAR CELLS

BRIEF DESCRIPTION OF THE INVENTION

BACKGROUND AND SUMMARY OF THE INVENTION

The invention relates to a monolithic cascade cell for converting incident light radiation into electrical energy.

Many semi-conductive materials, particularly those of the Group III-V type, respond to incident photons by producing current flow and thus convert the incident light energy into electrical energy. Accordingly, such materials are attractive for conversion of solar energy into electrical energy.

There are a number of practical difficulties in utilizing such materials for generation of electrical power. One of the substantial difficulties is that a single solar cell of a given material forming either a homojunction or heterojunction is sensitive only to a limited range of photon energies. Photons above that range will not be efficiently converted into electrical energy since a portion of the energy above the range will be wasted as heat and photons below that range will not be converted at all, so that the resulting energy conversion efficiency of the cell is quite low, typically below 20%.

In order to increase that efficiency, it has been proposed to associate together a number of different semi-conductive layers, each responsive to a different range of photon energies. The patent to Jackson, U.S. Pat. No. 2,949,498, suggests a stack of discrete solar cells of this type, each of which is capable of conversion of photons in a particular range of photon energy so that the cells together encompass a greater portion of the solar spectrum than a single cell.

However, stacked cells as taught by Jackson (i.e., cells which are fabricated separately and then mechanically attached to form a stack) are difficult and, therefore, costly to fabricate. The source of the difficulty arises because free carrier absorption within the cells substantially reduces the photon flux available to the lower bandgap cells in the stack when the higher bandgap cells are thicker than approximately 0.001 cm. (0.0004). Photons absorbed through free carrier optical transitions do not contribute to energy conversion and serve only to raise the temperature of the cell which in turn reduces conversion efficiency. In practice, therefore, the efficiency can be less than for a single cell. For high efficiency, the total thickness of each cell, above the bottom cell, must be considerably less than 0.001 cm. in order for the lower photon energy flux to pass unattenuated through each layer comprising a cell and into the next cell of lower bandgap. However, cell thicknesses of less than 0.010 cm. (0.004") cannot be reliably produced and assembled separately because of excessive cell breakage during processing and stack assembly.

In addition, to minimize photon flux shielding, the top and bottom contact pattern of each cell, except the bottom cell, should be identical and indexed from cell-to-cell during stack assembly. Alternatively, the bottom contact of each cell above the bottom cell may be of a peripheral pattern and indexed from cell-to-cell during stack assembly.

Moreover, the reflection losses, even with anti-reflection coatings or textured surfaces, at the top and the bottom surfaces of each cell in a stack also serve to reduce the flux available to cells further down in the stack. Reflection loss may be 15% at any one surface. Therefore, in a two-cell stack, this results in about a 40% drop in flux available to the bottom cell due to reflection losses alone.

The net effect of free carrier absorption and reflection losses on a voltage aiding, series connected, two-terminal stacked structure is that the efficiency may be substantially less than the efficiency obtained from any one of the cells operating as a single cell exposed to the full solar spectrum.

Many of the problems of a discrete stack can be overcome by a monolithic, cascade solar cell structure which circumvents the losses arising from free carrier absorption and multiple reflections. It also simplifies the electrical contact between cells. Because of the known technology available for fabricating monolithic, multiple layer devices, thin layers may be fabricated in which free carrier absorption loss is extremely small, and, therefore, its effect on efficiency, negligible. Due to the monolithic construction, reflection losses are also greatly reduced.

The patent of James, U.S. Pat. No. 4,017,332, describes a monolithic cascade solar cell structure in which some of these problems can be overcome by utilizing layers of different types of semi-conductive materials epitaxially deposited one on top of the other to eliminate problems of assembly and reflection. Thus, the efficiency of the overall cell can be increased provided that it is designed so that adverse factors as described generally above do not over-balance the potential increase in efficiency. In order to electrically connect the layers, and thus avoid the necessity for an intermediate terminal, a heterojunction is provided having dislocations due to lattice constant mismatch which, according to James, provides a low resistance series connection through tunnelling action between the two layers.

This lattice constant mismatch model is difficult to fabricate because it is difficult to insure that most or all of the dislocations reside at the interface which is a necessary condition for tunnelling action. Furthermore, the dislocations due to lattice mismatch will result in the dark current increasing in both the first and second layers, i.e., there will be an increase in the hole contribution of the first layer and in the electron contribution in the second layer. This will reduce the efficiency of the overall cell.

Another problem with the structure of James is that the layer (heterojunction) separating the potential generating layers is optically active, i.e., it has a bandgap lower than the top layer. This will generate a potential opposing the potentials generated in the top and bottom layers and reduce the efficiency, possibly even below the efficiency of one layer or cell alone.

The present invention relates to an improved cell of the general type described in the James patent in which the junctions within the first and second energy converting layers are homojunctions as in James but in which, in one embodiment, the third layer similarly provides a homojunction operating as a tunnel junction to connect the layers together. The use of a homojunction as in the present invention insures satisfactory tunnelling and a homojunction functioning as a tunnel diode can be satisfactorily produced with existing methods.

Further, according to the present invention, the bandgap of the third layer forming the tunnel junction is greater than the bandgap of the first layer so that the third layer is optically inactive and photons passing through that first layer are not converted into electrical energy in the layer which forms the tunnel junction, and thus pass unattenuated to the bottom or second layer. This is important because if this layer is optically active as in James, the generated photopotential will oppose the other two voltages and reduce the overall efficiency.

Applicant has discovered several specific configurations of solar cells using specific materials which provide high efficiency and are advantageous for a number of different reasons, including minimal lattice mismatch. When necessary, the effects of mismatch can be minimized by use of graded layers between the voltage producing layers. Efficiencies of 30–40% can be achieved. These specific embodiments are described in detail below.

Monolithic devices of this type can be made to have the generated voltages aid or oppose. For voltage aiding configurations only two terminals are required whereas at least three are required for a voltage opposing cell. For most applications, the two-terminal cell is preferred since it is simpler to fabricate. However, the three terminal configuration may exhibit a higher efficiency since the same terminal current need not flow through each junction. The two junction, voltage aiding cascade cell is highly attractive from the standpoint of both theoretical efficiency and high temperature performance. It is also likely to offer an improvement in radiation hardness over contemporary silicon cells.

According to a further embodiment of the invention described below, other types of detectors and light emitting diodes may be conveniently and advantageously fabricated in a cascade structure. In a specific illustrated embodiment, one layer is formed as a light emitting device and the other layer formed as a light receiving device operating at different wavelengths. Thus, a receiver-transmitter system can be configured within the same device, and the same optical fiber and/or optical system used to supply light to and take light from the device.

Many other objects and purposes of the invention will be clear from the following detailed description of the drawings.

Figure 1:
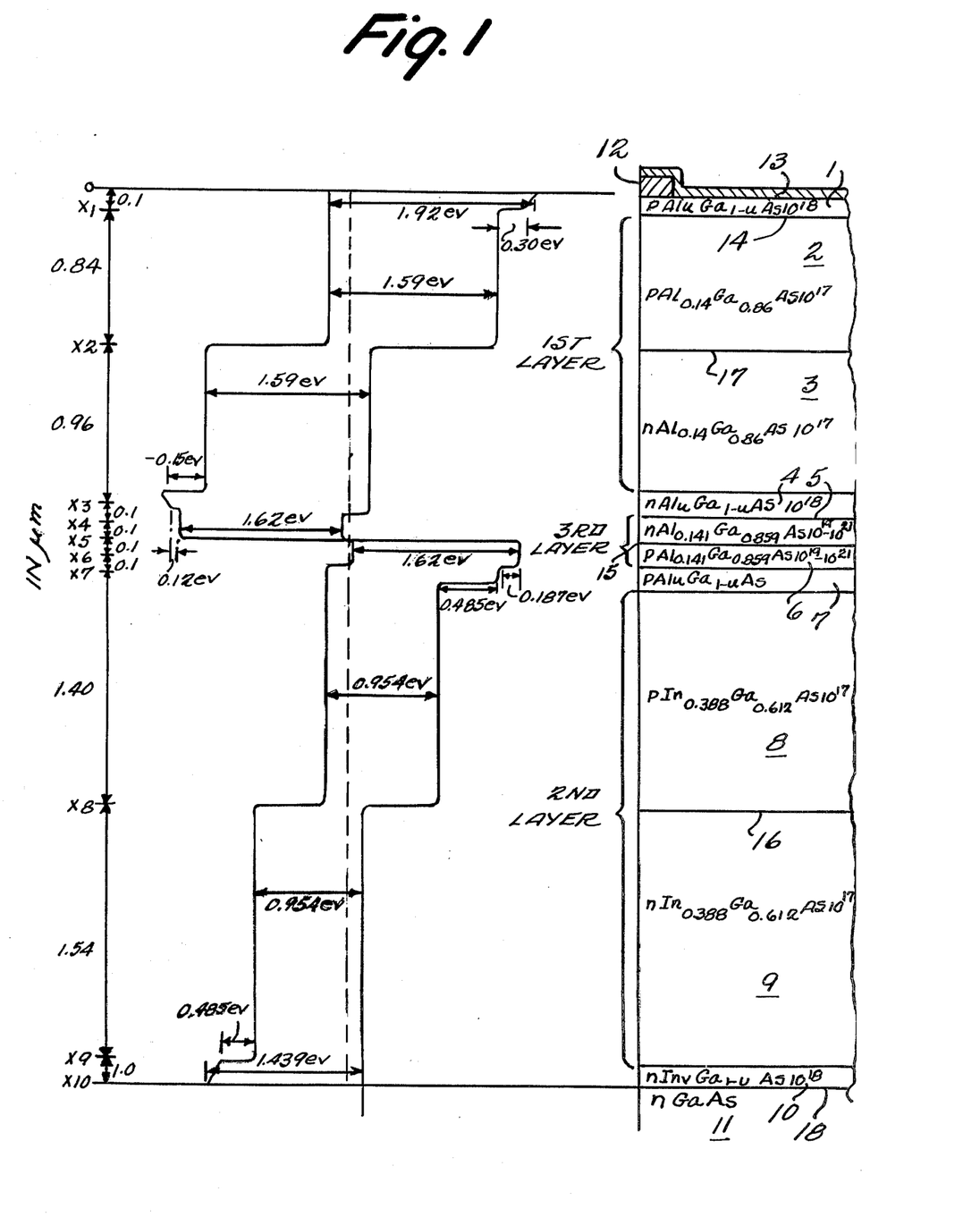
FIG. 1 shows a diagram of a first embodiment of the present invention with voltage aiding layers and two terminals.

DETAILED DESCRIPTION OF THE DRAWINGS:

Reference is now made to FIG. 1 which schematically illustrates a first embodiment of the present invention showing the semi-conductive layers defining different doped regions and showing the bandgaps for each of those respective regions.

Figure 3:
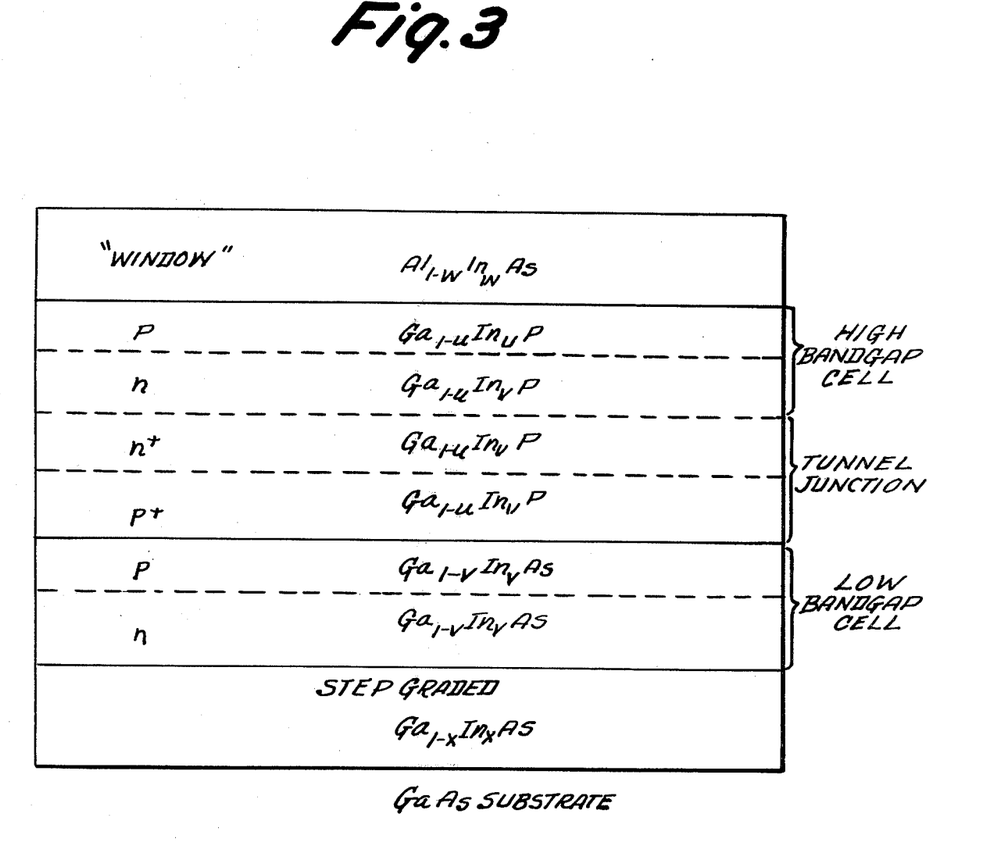
FIG. 3 shows a second embodiment with voltage aiding layers, but without the lattice matching layers.
Figure 4:
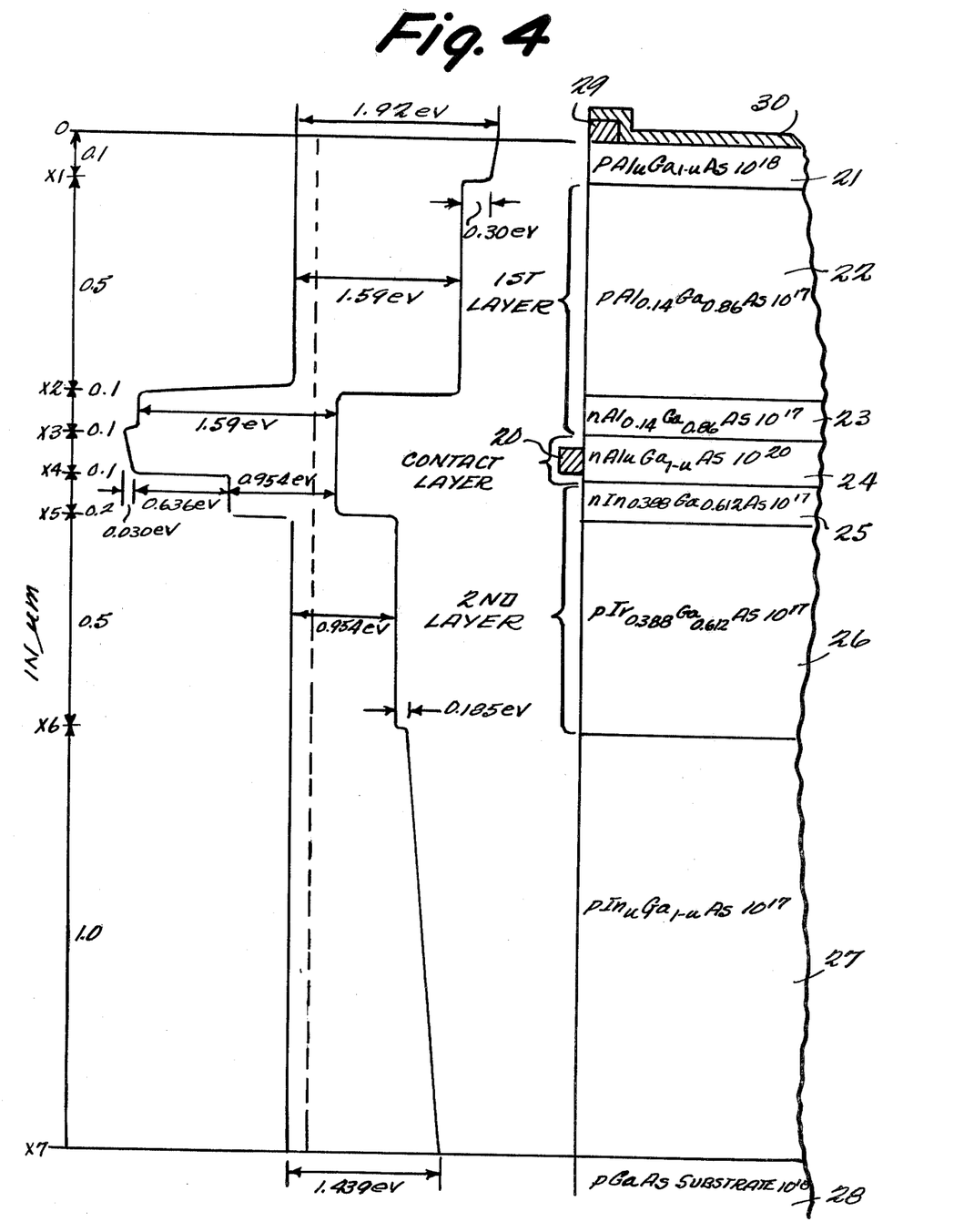
FIG. 4 shows a third embodiment of the present invention with voltage opposing layers and three terminals.

Basically, the embodiment illustrated in FIG. 1 as well as the embodiments of FIGS. 3 and 4, are comprised of three layers. First and second layers of suitable semi-conductive materials preferably from Groups III-V, each convert incident photons into electrical energy and are "stacked" with the first layer atop the second layer so that light passes through the first layer to the second layer. The first layer is deliberately designed to have a bandgap higher than the bandgap of the second layer so that the second layer responds to some of the photons passing through the first layer to enhance the overall efficiency of the cell provided that the cell is designed to minimize other factors which reduce efficiency, such factors being discussed in greater detail below. The first and second layers are each made up of a different material with the material of each layer being doped to provide a homojunction in each of the layers so that the incident photons produce a potential across each homojunction. Each layer is effectively a "potential well". The layers are formed on a substrate by well known sequential epitaxial growth processes, preferably by the liquid phase epitaxial (LPE) method.

A third layer separates the first and second layers and is similarly formed of a semi-conductive material chosen from Group III-V materials to have a bandgap higher than the bandgap of the first layer so that none of the photons passing through the first layer is converted to electrical energy in the third layer. The third layer should be as thin as possible, preferably 0.1 to 1.0 $\mu$m, to minimize free carrier absorption. With this thickness, free carrier absorption will be less than 0.5%. A tunnel homojunction is formed in the third layer which connects the potentials produced by the first and second layer so that electrical energy can be removed by terminals connected to the remote faces of the respective first and second layers.

In addition to the first, second, and third layers, as defined above, a number of additional layers are provided in FIGS. 1 and 4 to minimize lattice mismatches, as discussed in greater detail below, and thus minimize minority carrier recombinations due to dislocations so efficiency will be increased.

Discussing the regions of the various layers from top to bottom, region 1 is a p-doped, $Al_uGa_{1-u}As$ layer which is heavily doped ($10^{18}-10^{19}cm^{-3}$) with a 1.920 eV band at the surface graded to 1.890 eV to accelerate minority carriers toward the first layer p-n homojunction 17. Region 1 is thin (e.g., 0.1 $\mu$m) and allows the majority of the photon flux to pass unattenuated to layers below. Because of its thinness, band-to-band and free carrier absorption are minimized. In addition, region 1 reduces surface recombination losses and provides a low sheet resistance conduction path for the terminal current to terminal 12. A conventional antireflection coating 13 is provided atop region 1.

Below region 1 is the first layer which converts photons to electrical energy and which is divided into a p-doped region 2 and an n-doped region 3 with a p-n homojunction 17 between the two regions. While homojunctions are preferred, heterojunctions in the first and second layers might be employed. In the specific embodiment of FIG. 1, regions 2 and 3 are $Al_{0.14}Ga_{0.86}As$, approximately 0.84 μm and 0.96 μm thick, respectively, moderately doped ($10^{17}cm^{-3}$), and exhibit a 1.590 eV bandgap. Moderate doping aids in minimizing electron space charge recombination contributions to dark current. The thickness of regions 2 and 3 in this example has been chosen on the basis of maximizing conversion efficiency, rather than maximizing short-circuit current or minimizing dark current.

Between the first layer and the above-defined third layer is another layer consitituting region 4 inserted to compensate for lattice mismatch and which must be optically inactive, have low series resistance, and minimize free carrier absorption. This layer in the example of FIG. 1 is n-doped $Al_uGa_{1-u}As$, heavily doped ($10^{18}cm^{-3}$), and thin (0.1 μm). As shown in FIG. 1, a bandgap of greater than 1.62 eV is thus provided. Region 7, serving an identical function between the second and third layers, is a p-type material otherwise identical to that described above. Regions 4 and 7 compensate for lattice mismatches and where lattice mismatch is small or unimportant, regions 4 and 7 may be deleted.

The third layer is divided into n-doped region 5 forming half the tunnel homojunction and p-doped region 6 forming the other half of the tunnel homojunction. $Al_{0.141}Ga_{0.859}As$ material, thin (0.1 μm) and heavily doped ($10^{19}-10^{21}cm^{-3}$) to provide a minimum 1.62 eV bandgap has been found satisfactory. The thinness of the regions 5 and 6 minimizes free carrier absorption and the bandgap is high enough to insure that the layer will be optically inactive.

The second layer, which has a bandgap lower than the bandgap of the first layer, is divided into a p-doped region 8 and an n-doped region 9 forming a homojunction 16 therebetween. Regions 8 and 9, $In_{0.388}Ga_{0.612}As$, of approximately 1.40 and 1.54 μm thickness respectively, are moderately doped ($10^{17}cm^{-3}$) to provide a bandgap of 0.954 eV for the second layer. Moderate doping aids in minimizing electron-hole space charge recombination contributing to dark current.

Region 10 is similarly provided to deal with lattice mismatching and to accelerate the movement of holes toward homojunction 16. $In_uGa_{1-u}As$ graded material ending with n-doped GaAs at junction 18, has been found to be satisfactory. Below the second layer and region 10 is the substrate 11 of n-doped GaAs on which the cell has been formed. Germanium is an alternative substrate material.

The important regions are 1, 2, 3, 5, 6, 8 and 9. It has been found that satisfactory results can be obtained without regions 4, 7 and 10, but these regions may be desirable in certain configurations.

The region thicknesses and bandgaps shown in FIG. 1 were obtained by using the general solution to the integral form of the steady-state continuity equation for each of the 10 regions shown in the figure. The manner in which such calculations are done is explained further in a report entitled "Solar Cell Design Study," which is available to the public at Wright Patterson Air Force Base, under contract F33615-76-C-1283, the disclosures of which are hereby incorporated by reference into the present application.

Various optimum bandgap combinations which maximize efficiency may be calculated in the above manner. The optimum bandgap values are dependent on the surface recombination velocity and are also functions of the specific materials properties (mobilities, lifetimes, absorption coefficients—free carrier as well as bandedge transitions, dielectric constants, etc.), air mass, and temperature. The structure shown in FIG. 1, for example, is the optimum structure for the following conditions: air mass=zero, temperature=290° K., recombination velocity=$10^6$ cm/sec, and unity solar constant.

Figure 2:
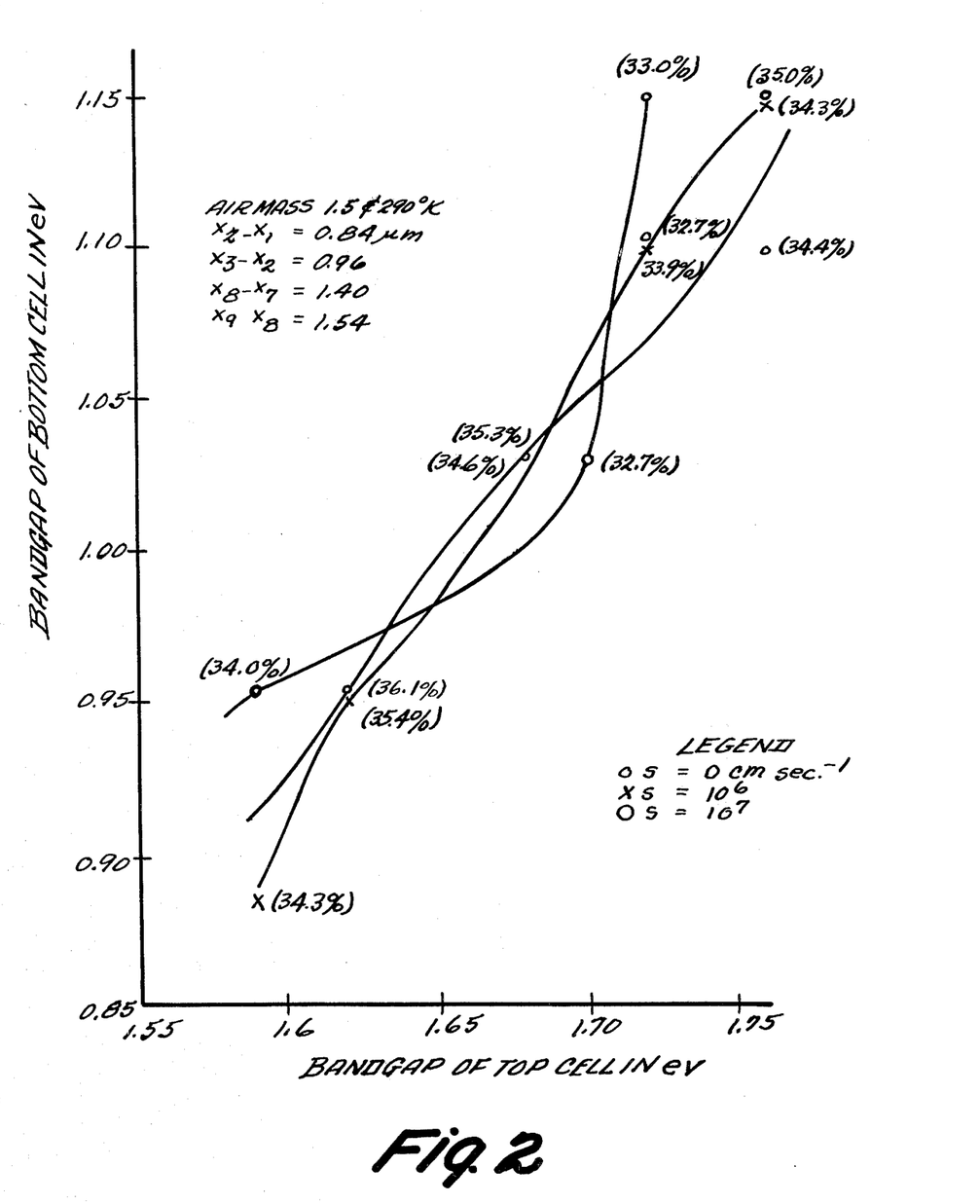
FIG. 2 shows the optimum bandgap combination for the top and bottom layers for a number of recombination velocities. The calculations are for an air mass of 1.5 on a structure (FIG. 1) that has been optimized at air mass zero; and different sets of curves can be generated for each different air mass.

FIG. 2 shows the results of similar calculations for air mass=1.5 on the structure of FIG. 1. The maximum efficiency (36.1%) occurs for zero recombination velocity and requires the bandgap combination of 0.95 and 1.62 eV. Similar calculations can be made for other air masses, temperatures, recombination velocities, and solar concentrations.

It can be shown that regions 4, 7 and 10 in FIG. 1 are not required in a cascade cell to obtain efficiency values above 30%. Therefore, if the necessity for lattice matching through graded layers is removed, the component active layers in FIG. 1 are reduced to seven. This need may be removed by a judicious choice of binary, ternary and/or quaternary alloy semiconductors, where no lattice mismatch is present, or where the bandedge discontinuities make interfacial recombination losses negligible or where lattice mismatch does not give rise to interfacial recombination losses. An example is given in FIG. 3 of a judicious choice of materials where lattice mismatch is eliminated or minimized.

The Group III-V materials system offers nearly one dozen materials combinations to form a two-junction cascade solar cell structure comprised of 1.59 and 0.95 eV bandgap homojunctions. This number is, however, reduced drastically when one imposes the additional restriction that alloys in a given system must have nearly the same lattice constant. Two of the most attractive candidate systems from the standpoint of spanning the desired bandgap range and having a uniform lattice constant are $Al_{1-x}Ga_xAs_{1-y}Sb_y$ and $Al_{1-w}In_wAs/Ga_{1-u}In_uP/Ga_{1-v}In_vAs$. Both of these systems are reasonably well characterized and can be graded to lattice match GaAs substrates; unlike the $Al_{0.14}Ga_{0.86}As/Ga_{0.612}In_{0.388}As$ system of FIG. 1, the above systems avoid the large lattice mismatch between top and bottom cells. However, there is a miscibility gap over the composition range of interest in the $Al_{1-x}Ga_xAs_{1-y}Sb_y$ system, making it unsuitable for LPE application.

The material combination applied to the structure of FIG. 3 shows a simpler structure that retains the essential features of the optimized design described above, and also offers the advantages of the more attractive materials system mentioned above. The simplified cross-section shown in FIG. 3 consists of seven active layers. The structure contains the designated first and second layers, tunnel junction layer, and graded bandgap surface layer. With this particular combination of materials, lattice mismatch in the active region of the cell is significantly reduced.

In FIG. 3, the upper first layer is fabricated from the alloy $Ga_{1-u}In_uP$ with the composition fraction, u, chosen to provide a 1.59 eV bandgap. Similarly, the bottom second layer is fabricated from the alloy $Ga_{1-v}In_vAs$ with v chosen to provide a 0.95 eV bandgap. The $Al_{1-w}In_wAs$ surface layer is graded in composition to provide a built-in field of 3000 V cm$^{-1}$ which accelerates electrons toward the p-n junction. Moreover, the conduction bandedge discontinuity (shown as 14 in FIG. 1) is also present and serves to reduce the electron contribution to the dark current of the top solar cell.

The homojunction forming the tunnel p-n junction (shown as 15 in FIG. 1) is also fabricated from the alloy $Ga_{1-u}In_uP$. The structural optimization of the top cell was made on the basis that the free carrier absorption loss is negligible for the photon energies equal to or less than 1.59 eV. The tunnel diode will not appreciably affect the photon flux exiting the n-doped $Ga_{1-u}In_uP$, and, therefore, the only attenuation of the exit intensity from the tunnel diode will be a slight loss due to free carrier absorption in the thin, heavily doped layers of this diode.

The valence band discontinuity terminating the first layer serves to increase minority carrier (hole) accumulation or confinement in the n-doped $Ga_{1-u}In_uP$ layer, thereby reducing the hole contribution to dark current. Similarly, the conduction band discontinuity terminating the tunnel diode serves to produce electron accumulation in the p-doped $Ga_{1-y}In_yAs$ layer and to reduce the electron contribution to the dark current of the bottom second layer. The valence band discontinuity at the substrate interface also serves to reduce the hole contribution to the dark current in the n-doped $Ga_{1-y}In_yAs$. Thus the bandedge discontinuities have been shown to be more effective in increasing the efficiency than the inclusion of regions 4 and 7 with their aiding built-in field. The simplified structure of FIG. 3 with the inclusion of the bandedge discontinuities sandwiching layers one and two serves effectively to increase the efficiency through the reduction of dark current.

FIG. 4 illustrates a voltage opposing configuration with a third terminal 20 connected to a layer 24 for removing the currents. No tunnel diode is, of course, necessary, since the voltages do not have to be connected in series. In FIG. 4, window region 21, coating 30, and terminal 29 provide the same functions as the corresponding regions in FIG. 1. The first layer is made up of regions 22 and 23 and the second layer, of regions 25 and 26. Region 24 is inserted between the first and second layers to serve as a contacting layer to terminal 20. Region 27 is step-graded as described above with regard to the corresponding layer in FIG. 3.

The type or types of detectors used in a monolithic cascade detector structure depend almost entirely on the application. The types of detectors which are suitable in cascade structures are photodiodes, avalanche photodiodes and photoconductors. In any one cascade structure, one or more types may be incorporated. The design principles are similar to those of a cascade solar cell. The most important is that the detectors, of whatever type and number, are arranged, from the exposed surface of the cascade structure into and through the monolithically constructed devices, in order of decreasing bandgap. Moreover, free carrier absorption should be minimized for optimum performance.

In some applications, complementary devices may be required which necessitate a cascade LED device or a cascade combination detector and LED device. The design principles are an extension of those for a solar cell structure. The bandgaps in a structure containing only LEDs, will have them arranged in decreasing bandgap (or in decreasing emission photon energy) from the surface down into the structure. In addition, free carrier absorption should be minimized. Each LED and/or detector may be operated independently of the other devices in the monolithic three-terminal structure.

There are many different combinations of device types and bandgaps which may have practical applications. For example, in a data transmission link using photodiodes and/or avalanche photodiodes as receptors, two beams of different wavelengths can be independently transmitted and carry information over the same optical fiber and/or through the same receiver optics. This results in a doubling of the gain-bandwidth product at only a miniscule increment in cost compared to total system cost.

Another example is in passive detection using photoconductors in the 3 to 5 μm portion of the infrared spectrum. The absorption which is sometimes observed at approximately 4 μm in the atmosphere, under high water vapor conditions, reduces the signal-to-noise ratio. A cascade photoconductive structure containing two photoconductor devices and appropriate semiconductor layers for filtering to allow transmission in the ranges of 3.0 to 3.8 μm and 4.2 to 5.0 μm will increase signal-to-noise.

The band structures for these various cascade devices are identical in some cases while in others they are similar. However, the basic principles delineated for the solar cell apply. Therefore, in the following discussion the band structure for each unique combination is not shown since it follows and may be deduced from the previous discussion.

Figure 5:
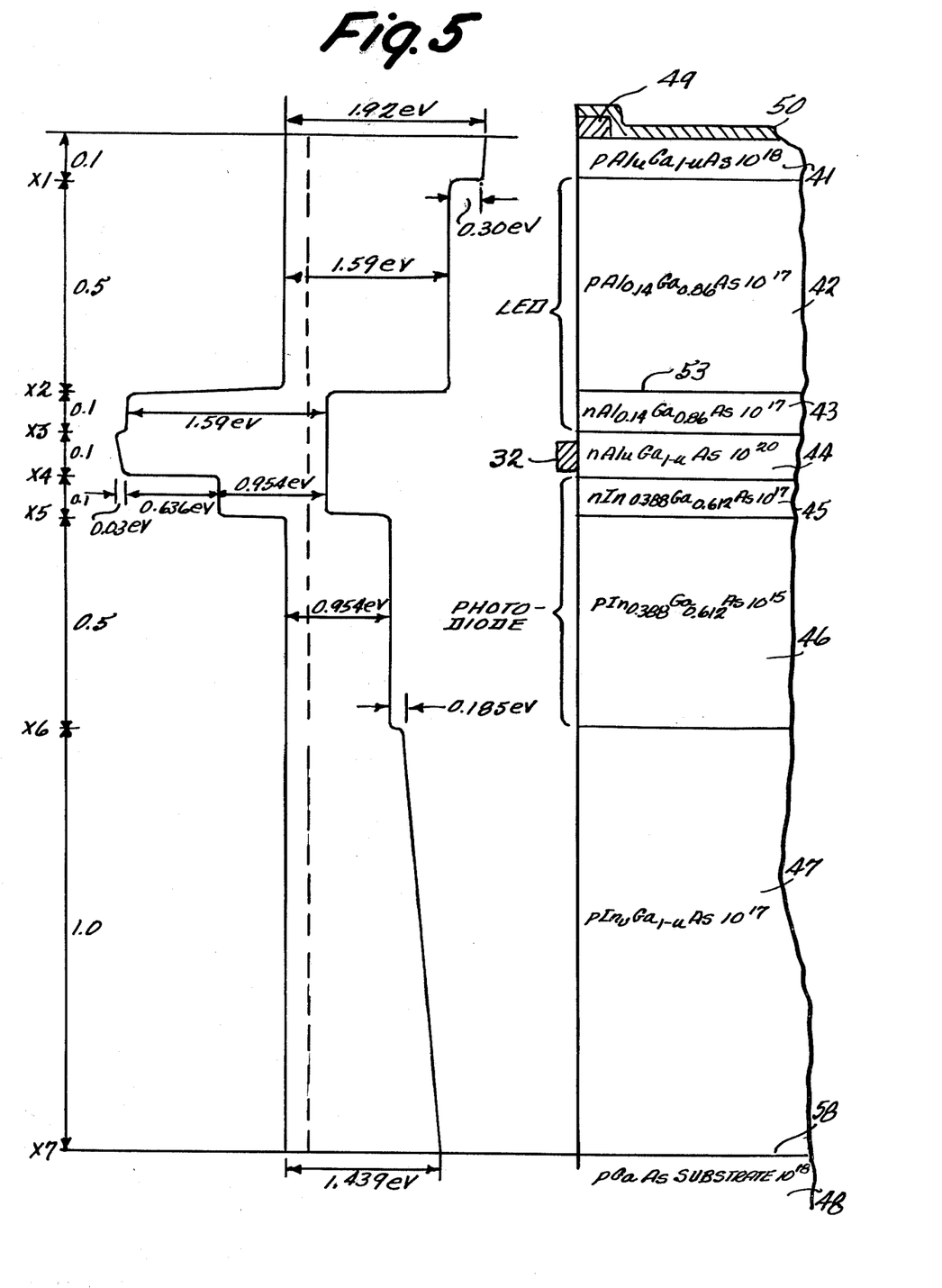
FIG. 5 shows a fourth embodiment with a separate light emitting and light receiving layer, each incorporated in the cascade structure.

FIG. 5 shows the band structure of a cascade device which is comprised of an LED emitting a narrow spectrum at approximately 1.59 eV and a photodiode with a bandgap at 0.954eV. Each may be operated separately and independently of the other.

The embodiment of FIG. 5 operates in essentially the same fashion as the embodiments of FIGS. 1, 3 and 4. A terminal 32 is provided which is common to both the LED and the photodiode.

Region 41 is p-doped $Al_uGa_{1-u}As$ graded layer with 3000 volts/cm built-in-field to reduce surface recombination losses due to injected electrons recombining non-radiatively through surface states rather than in the junction region with the consequent radiative transition. The bandgap is 1.92 eV at the surface. Doping is $10_{18}cm^{-3}$ to reduce joule heating loss. Bandedge discontinuity aids in confining injected minority carrier electrons to where there is a greater probability that they will recombine and emit a photon of energy of approximately 1.59 eV.

Region 42 is part of the first layer and is p-doped $Al_{0.14}Ga_{0.86}As$, 1.59 eV bandgap, approximately 0.5 μm in thickness to confine carriers to region 42. Doping is $10^{17}cm^{-3}$ to eliminate or reduce non-radiative space charge recombination current.

Region 43 is an n-doped $Al_{0.14}Ga_{0.86}As$, 1.59 eV bandgap, approximately 0.1 μm to confine carriers to region 43. Doping is $10^{17}cm^{-3}$ to eliminate or reduce non-radiative space charge recombination current. Regions 42 and 43 define an LED.

Region 44 is n-doped $Al_uGa_{1-u}As$, >1.59 eV bandgap, approximately 0.1 to 1.0 μm in thickness to serve as common contact 32 for LED and photodiode.

Region 45 is n-doped $In_{0.388}Ga_{0.612}As$, 0.954 eV bandgap, $10^{17}cm^{-3}$ to eliminate or reduce space charge generation current and 0.1 μm in thickness for high spectral response for photodiode operation.

Region 46 is p-doped $In_{0.388}Ga_{0.612}As$, 0.954 eV bandgap, $10^{15}cm^{-3}$ to eliminate or reduce space charge generation current, and 0.5 μm thickness for high spectral response for photodiode operation.

Region 47 is p-doped $In_uGa_{1-u}As$ graded bandgap material where at junction 58 the graded composition is pure GaAs or u=0.

Region 48 is the p-doped GaAs substrate.

A top surface ohmic contact 49 is provided together with an anti-reflection coating 50, which is broad band from approximately 1.58 to 0.955 eV.

The conduction band discontinuity between regions 41 and 42 serves to confine injection electrons to region 42 and thus increase LED emission efficiency. The p-n homojunction between regions 42 and 43 is forward biased by applying voltages between contacts 49 and 32. The valence bandedge discontinuity between regions 43 and 44 serves to confine injected holes to the region 43 and also increase LED emission efficiency. Similarly, between regions 44 and 45 the valence bandedge discontinuity serves to produce charge (holes) accumulation in region 45.

A voltage aiding configuration as in FIG. 1 can be modified to a receiver/transmitter cascade by replacing the tunnel diode layer with a contact layer and terminal. Further, with a cascade of this type, the bandgaps need not be restricted to the combinations used for the solar spectrum. Further, a cascade structure with two photodiodes or two LEDs may be useful.

Many changes and modifications in the above-described embodiments of the invention can, of course, be carried out without departing from the scope thereof. While the III-V group is preferred, other Groups can be used such as II-VI or mixed Groups. All values of bandgaps, thicknesses and dopings are, of course, approximate and can be varied as desired. Small changes in parameters should not substantially reduce device performance. While the cells discussed above have two layers producing potentials, additional voltage generating layers can be added as desired. Accordingly, the scope of the invention is intended to be limited only by the scope of the appended claims.

What is claimed is:

1. A monolithic cascade cell for converting incident radiation into electrical energy comprising:
   a first semi-conductive layer of a first material having a first given bandgap, said first layer being doped into p and n regions with a junction therebetween so that incidence of radiation of wavelength above a predetermined energy produces an electrical potential across said junction of said first layer and below said first predetermined energy substantially passes through said first layer;
   a second layer of a second material having a second given bandgap, said second layer being doped into p and n regions with a junction therebetween so that the radiation passing through said first layer above a second predetermined energy produces an electrical potential across said junction of said second layer; and
   a third layer between said first and second layers of a third material having a bandgap greater than said first bandgap, so that substantially no electrical energy is produced by radiation absorbed in said third layer, and doped into p and n regions with a homojunction forming a tunnel junction therebetween to electrically connect said potentials in said first and second layers in series.

2. A cell as in claim 1, further including a further layer of a Group III-V material above said first layer for reducing surface recombination losses and providing a low sheet resistance conducting path.

3. A cell as in claim 2, wherein said further layer is substantially 0.1 $\mu$m thick and doped to $10^{18}-10^{19}$ cm$^{-3}$.

4. A cell as in claim 2, wherein said further layer is graded.

5. A cell as in claim 1, including a fourth optically inactive layer between said first and third layers for minimizing free carrier absorption and lattice mismatch and a fifth optically inactive layer between said third and second layers for minimizing free carrier absorption and lattice mismatch.

6. A cell as in claim 5, including a semiconductor substrate and a sixth optically inactive layer between said substrate and said second layer for minimizing free carrier absorption and lattice mismatch.

7. A cell as in claim 6, wherein said fourth, fifth and sixth layers are graded.

8. A cell as in claim 1, including terminals connected to said first and second layers.

9. A cell as in claim 1, wherein said first and second layers are arranged so that said potentials are additive.

10. A cell as in claim 1, wherein the thickness of said third layer is between 0.1 and 1.0 $\mu$m.

11. A cell as in claim 1, wherein said junctions in said first and second layers are homojunctions.

12. A cell as in claim 1, wherein said first and second materials are Group III-V materials.

13. A cell as in claim 1, wherein said first layer is p-doped Al$_u$Ga$_{1-u}$As, said second layer is p-doped In$_x$Ga$_{1-x}$As and said third layer is n-doped Al$_z$Ga$_{1-z}$As.

14. A cell in claim 12, wherein u is 0.14, y is 0.388 and z is 0.141.

15. A monolithic cascade cell comprising:
   a first semi-conductive layer of a first material having a first given bandgap, said first layer being doped into p and n regions with a junction therebetween so that incidence of radiation of wavelength above a predetermined energy produces an electrical potential across said junction of said first layer and below said predetermined energy substantially passes through said first layer;
   a second layer of a second material having a second given bandgap, said second layer being doped into p and n regions with a junction therebetween so that the radiation passing through said first layer above a second predetermined energy produces an electrical potential across said junction of said second layer, at least one of said second and first layers being a light emitting layer;
   a third layer between said first and second layers; and
   a terminal on said third layer between said first and second layers and a terminal on said first layer for applying an exciting voltage to said one layer to cause light emission, said terminal on said third layer removing the current generated by said other layer.

16. A cell as in claim 15, wherein said one layer is said first layer.

17. A cell as in claim 15, including a semi-conductor substrate and a graded layer between said substrate and said second layer.

18. A cell as in claim 15, wherein said first layer is an LED and said second layer is a photodiode.

19. A cell as in claim 17, wherein said first layer is Al$_u$Ga$_{1-u}$As, and said second layer is In$_y$Ga$_{1-y}$As.

20. A monolithic cascade cell comprising:
   a first semi-conductive layer of a first material having a first given bandgap, said first layer being doped into p and n regions with a junction therebetween so that application of a voltage across the junction will produce radiation of wavelength above a predetermined energy;

a second layer of a second material having a second given bandgap, said second layer being doped into p and n regions with a junction therebetween so that the radiation passing through said first layer above a second predetermined energy produces an electrical potential across said junction of said second layer;

a third layer between said first and second layers; and a terminal on said third layer between said first and second layers and a terminal on said first layer for applying an exciting voltage to said first layer to cause light emission and for removing the current generated in said second layer.

21. A monolithic cascade cell for converting incident radiation into electrical energy comprising:

a first semi-conductive layer of a first material having a first given bandgap, said first layer being doped into p and n regions with a junction therebetween so that incidence of radiation of wavelength above a predetermined energy produces an electrical potential across said junction of said first layer and below said predetermined energy substantially passes through said first layer;

a second layer of a second material having a second given bandgap, said second layer being doped into p and n regions with a junction therebetween so that the radiation passing through said first layer above a second predetermined energy produces an electrical potential across said junction of said second layer;

a third layer between said first and second layers; and a terminal on said third layer between said first and second layers, and a terminal on said first layer, said first and second layers being formed to produce opposing voltages.

22. A cell as in claim 21, including a semi-conductor substrate and a graded layer between said substrate and said second layer.

23. A cell as in claim 21, including a further semiconductor layer between said first and second layers, said terminal connecting to said further layer.

24. A cell as in claim 22, wherein said first layer is $Al_uGa_{1-u}As$, and said second layer is $In_yGa_{1-y}As$.

25. A monolithic cascade cell comprising:

a first semi-conductive layer of a first material having a first given bandgap, said first layer being doped into p and n regions with a junction therebetween so that application of a voltage across the junction will produce radiation of wavelength above a predetermined energy;

a second layer of a second material having a second given bandgap, said second layer being doped into p and n regions with a junction therebetween so that application of a voltage across the junction will produce radiation of a wavelength below said predetermined energy which passes through said first layer;

a third layer between said first and second layers; and a terminal on said third layer between said first and second layers and a terminal on said first layer for applying exciting voltages to said first and second layers to cause light emission.

* * * * *